United States Patent
Yoshii

(10) Patent No.: US 7,351,284 B2
(45) Date of Patent: Apr. 1, 2008

(54) FULLERENE CRYSTAL AND METHOD FOR PRODUCING SAME

(75) Inventor: Tetsuro Yoshii, Minato-Ku (JP)

(73) Assignee: Nippon Sheet Glass Company, Limited, Tokyo (JP)

(*) Notice: Subject to any disclaimer, the term of this patent is extended or adjusted under 35 U.S.C. 154(b) by 300 days.

(21) Appl. No.: 10/541,174

(22) PCT Filed: Jan. 8, 2004

(86) PCT No.: PCT/JP2004/000087

§ 371 (c)(1),
(2), (4) Date: Jun. 30, 2005

(87) PCT Pub. No.: WO2004/063433

PCT Pub. Date: Jul. 29, 2004

(65) Prior Publication Data

US 2006/0090689 A1    May 4, 2006

(30) Foreign Application Priority Data

Jan. 10, 2003  (JP) ............................. 2003-004126
Jan. 10, 2003  (JP) ............................. 2003-004127
Jan. 10, 2003  (JP) ............................. 2003-004128

(51) Int. Cl.
    *C30B 29/62* (2006.01)
(52) U.S. Cl. ............................. 117/68; 117/69; 423/445
(58) Field of Classification Search .................. 117/68, 117/69; 423/445
See application file for complete search history.

(56) References Cited

U.S. PATENT DOCUMENTS 5,851,503 A    12/1998   Mitani et al.

(Continued)

FOREIGN PATENT DOCUMENTS

JP         5-124894        5/1993

(Continued)

OTHER PUBLICATIONS

Swietlik et al, "Interactions of C60 with organic molecules in solvate crystals studied by infrared spectroscopy", CHemical Physics Letters, 254 (1996) pp. 73-78.*

(Continued)

*Primary Examiner*—Robert Kunemund
(74) *Attorney, Agent, or Firm*—Hamre, Schumann, Mueller & Larson P.C.

(57)  ABSTRACT

A production method of the present invention includes: a process of bringing a solution 12 and a second solvent 13 into contact with each other so that a liquid-liquid interface 14 is formed therebetween, where the solution 12 includes a first solvent containing a benzene derivative (A) whose content is at least 50 wt. % and fullerene dissolved in the first solvent, and the second solvent 13 has a lower solubility of the fullerene than that of the first solvent; and a process of allowing the solution 12 and the second solvent 13 to be mixed together through counter diffusion of the solution 12 and the second solvent 13 to deposit crystals of the fullerene. The benzene derivative (A) is at least one benzene derivative selected from the group consisting of a benzene derivative in which at least two hydrogen atoms of a benzene ring have been substituted, halogenated benzene, and alkoxybenzene.

22 Claims, 7 Drawing Sheets

U.S. PATENT DOCUMENTS

2002/0192143 A1    12/2002    Miyazawa et al.
2007/0009420 A1*    1/2007    Miyazawa et al. ....... 423/447.1

FOREIGN PATENT DOCUMENTS

JP          10-1306        1/1998
JP          2003-1600      1/2003

OTHER PUBLICATIONS

Miyazawa et al., "C 60 nanowhiskers formed by the liquid-liquid interfacial precipation method", journal Material Research vol. 17, No. 1 Jan. 2002, pp. 83-88.*

K. Myazawa, "Structure of $C_{60}$ Nanowhiskers Formed by Liquid Phase Synthesis", Heat Treatment, Apr. 2002, vol. 42, No. 2, pp. 81-82.

W. Kratschmer et al., "Solid $C_{60}$ : a new form of carbon", NATURE, Sep. 27, 1990, vol. 347, pp. 354-357.

J.M. Hawkins et al., A Crystallographic Analysis of $C_{60}$ (Buckminsterfullerence), J. Chem. Commun., Jun. 1, 1991, No. 11, pp. 775-776.

K. Miyazawa et al., $C_{60}$ nanowhiskers formed by the liquid-liquid interfacial precipitation method, J. Mater. Res., Jan. 2002, vol. 17, No. 1, pp. 83-88.

K. Miyazawa et al., "Formation of iodone-doped $C_{60}$ whiskers by the use of liquid-liquid interfacial precipitation method", J. Mater. Res., Sep. 2002, vol. 17, No. 9, pp. 2205-2208.

* cited by examiner

FULLERENE CRYSTAL AND METHOD FOR PRODUCING SAME

TECHNICAL FIELD

The present invention relates to a method for producing fullerene crystals, and fullerene crystals obtained by the method.

BACKGROUND ART

Diamonds and graphite are known as substances composed of carbon alone. Recently, a spherical cluster molecule that consists of 60 carbon atoms was found, and physical properties and applications thereof have been studied. This molecule is referred to as "fullerene" and has a soccer-ball-like shape. Furthermore, it has been reported that an aggregate of fullerene molecules is a face-centered cubic lattice and a substance having superconductive characteristics can be obtained by doping it with various elements.

A method of adding isopropyl alcohol to a toluene solution including fullerene dissolved therein has been reported as a method for obtaining fullerene crystals (K. Miyazawa, et al., J. Mater. Res., Vol. 17, No. 1, 83 (2002)). This reference describes that needle single crystals of fullerene having a diameter of 200 nm to 2 μm and a length of 0.15 mm to 5 mm are obtained. This method, however, had problems in that only a small amount of fullerene crystals deposit and the yield of the fullerene crystals is low.

Furthermore, JP05(1993)-124894A discloses, as a method of obtaining large single crystals of fullerene, a method of depositing fullerene crystals on a single crystal substrate of rubidium bromide, potassium iodide, or rubidium iodide by a vacuum deposition method. This method, however, requires a vacuum deposition apparatus having a vacuum degree of about 1.3 Pa×$10^{-4}$ Pa and also requires a single crystal substrate to be used for growing fullerene single crystals. Accordingly, the method includes complicated processes, which results in high costs for manufacturing fullerene single crystals.

JP10(1998)-001306A discloses, as a method of obtaining particulate crystals of fullerene, a method for producing fullerene polymers (for instance, crystals whose diameter is around 50 nm) by adding a poor solvent of fullerene (for example, ethanol) to a solution including fullerene dissolved therein (for instance, a benzene solution of C60 fullerene). The particulate crystals obtained by this method, however, have particle sizes as small as several nanometers and therefore are not suitable as materials to be subjected to observations and evaluations of fullerene crystals as well as surface reactions.

Moreover, a method of adding isopropyl alcohol to a toluene solution containing fullerene dissolved therein is disclosed as a method of obtaining needle crystals of fullerene (Kun-ichi MIYAZAWA, Heat Treatment, Vol. 42, No. 2, p. 81). This method, however, does not allow crystals to be obtained with a high yield.

DISCLOSURE OF THE INVENTION

With the above-mentioned situations in mind, the present invention is intended to provide a new method for producing fullerene crystals applicable in various fields, with a high yield.

The production method of the present invention includes:
(i) a process of bringing a solution and a second solvent into contact with each other so that a liquid-liquid interface is formed therebetween, wherein the solution includes a first solvent containing a benzene derivative (A) whose content is at least 50 wt. % and fullerene dissolved in the first solvent, and the second solvent has a lower solubility of the fullerene than that of the first solvent; and (ii) a process of allowing the solution and the second solvent to be mixed together through counter diffusion of the solution and the second solvent to deposit crystals of the fullerene. The benzene derivative (A) is at least one benzene derivative selected from the group consisting of a benzene derivative in which at least two hydrogen atoms of a benzene ring have been substituted, halogenated benzene, and alkoxybenzene.

In the production method described above, it is preferable that the benzene derivative (A) be one selected from a plurality of structural isomers of one type of benzene derivative with structural isomerism or one type of benzene derivative with no structural isomerism. This structure allows fullerene crystals having a specific shape to be obtained with a high yield.

In an example of the above-mentioned production method, the benzene derivative (A) is a benzene derivative of at least one selected from the group consisting of m-dialkylbenzene, m-dihalogenated benzene, halogenated benzene, 1,3,5-trialkylbenzene, 1,3,5-trihalogenated benzene, 3-halogenated toluene, and alkoxybenzene. This structure allows fibrous fullerene crystals to be obtained in the process (ii) described above.

In another example of the above-mentioned production method, the benzene derivative (A) is at least one selected from a benzene derivative with a benzene ring that has been substituted at the ortho-position and a benzene derivative with a benzene ring that has been substituted at the 1,2,4-positions. In the process (i), a solid wall is placed so as to form a solid-liquid interface with the solution. This configuration allows flaky fullerene crystals deposited on the surface of the wall to be obtained in the process (ii) described above.

In still another example of the above-mentioned production method, the benzene derivative (A) is one selected from a benzene derivative with a benzene ring that has been substituted at the para-position and a benzene derivative with a benzene ring that has been substituted at the 1,2,3-positions. This structure allows particulate fullerene crystals to be obtained in the process (ii) described above.

The present invention makes it possible to produce single crystals and other crystals with various shapes containing fullerene as a constituent element, with a high yield. The method of the present invention allows fullerene crystals to be obtained at low cost since the apparatus such as a vacuum deposition apparatus is not required and fullerene crystals are obtained through diffusion and mixing of two solutions.

The fullerene crystals with specific shapes that are obtained by the method of the present invention are applicable in various fields through the utilization of the characteristics thereof. A sheet can be formed using fibrous fullerene crystals that are obtained according to the present invention. In addition, fibrous or needle fullerene single crystals can be used as a member of a minute machine such as, for instance, a shaft of a micromachine. Furthermore, flaky fullerene crystals that are obtained according to the present invention are applicable to various uses through the utilization of flat crystal planes thereof. Moreover, the present invention allows particulate fullerene crystals whose mean particle size is at least 10 μm to be obtained by simple processes. The particulate fullerene crystals are applicable to various uses through the utilization of characteristics

BEST MODE FOR CARRYING OUT THE INVENTION

Embodiments of the present invention are described below. The production method of the present invention is a method for producing fullerene crystals. In this method, a solution (hereinafter also referred to as a "solution (A)") and a second solvent are brought into contact with each other to form a liquid-liquid interface therebetween, wherein the solution includes a first solvent containing a benzene derivative (hereinafter also referred to as a "benzene derivative (A)") and fullerene (hereinafter also referred to as "fullerene (A)") dissolved in the first solvent, and the second solvent has a lower solubility of the fullerene (A) than that of the first solvent (Process (i)).

The first solvent contains the benzene derivative (A) in an amount of at least 50 wt. % (more preferably at least 75 wt. %, and further preferably at least 90 wt. %, for instance, at least 95 wt. %).

The second solvent to be brought into contact with the solution (A) is a solvent having a lower solubility of the fullerene (A) than that of the first solvent. That is, a solvent having a low solubility of the fullerene (A) (i.e. a poor solvent) is used as the second solvent. Specifically, it is preferable that a solvent having a solubility (a saturated concentration) of the fullerene (A) of 0.01 mg/ml or lower (more preferably 0.002 mg/ml or lower) at 25° C. be used as the second solvent. The second solvent has compatibility with the first solvent.

When there is an excessively great difference in amount between the solution (A) and the second solvent in bringing the solution (A) and the second solvent into contact with each other, the fullerene does not deposit efficiently. Accordingly, the ratio in volume of the solution (A) to the total of the solution (A) and the second solvent is preferably 80 vol. % or lower, more preferably in the range of 10 to 50 vol. %.

Figure 1:
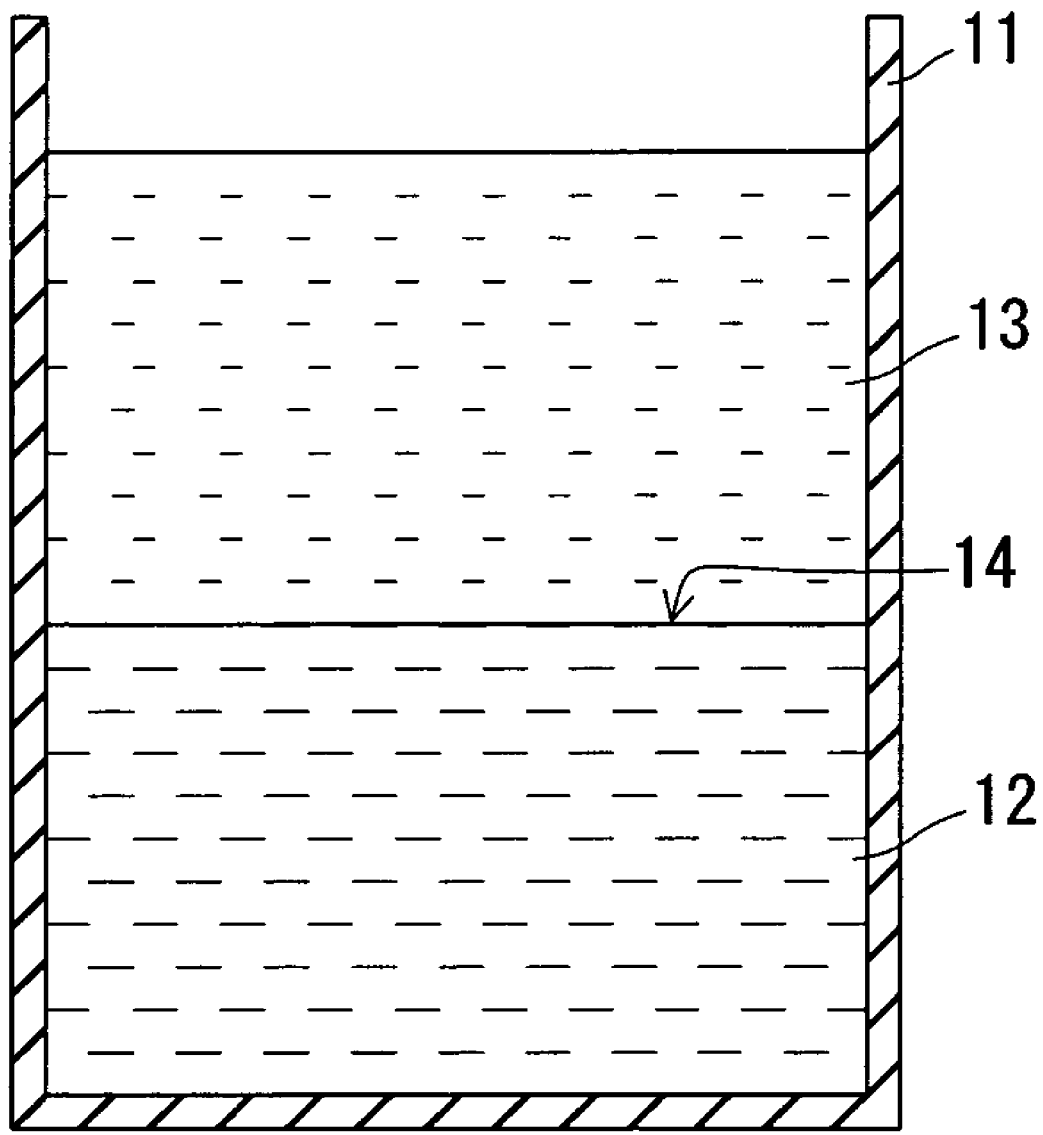
FIG. 1 is a cross-sectional view that schematically shows a process of the production method according to the present invention.

FIG. 1 schematically shows an example of the state of the solution (A) and the second solvent in the process (i). A solution (A) 12 and a second solvent 13 are in contact with each other at a liquid-liquid interface 14 in a container 11. When the solution (A) 12 is put into the container 11 and then the second solvent 13 is poured into the container gently, they are separated into two layers temporarily due to the differences in specific gravity and physical properties between them.

The benzene derivative (A) is at least one benzene derivative selected from the group consisting of a benzene derivative with a benzene ring in which at least two hydrogen atoms have been substituted, halogenated benzene, and alkoxybenzene. The use of the first solvent containing such a benzene derivative allows fullerene crystals to be obtained with a high yield.

Particularly, it is preferable that the benzene derivative (A) be one type of benzene derivative (hereinafter also referred to as a "benzene derivative (A')") that is expressed by one structural formula. That is, the benzene derivative (A') is one type of benzene derivative with no structural isomerism or one selected from a plurality of structural isomers of one type of benzene derivative with structural isomerism. When the first solvent contains such a benzene derivative (A') whose content is at least 50 wt. % (preferably at least 75 wt. %, and more preferably at least 90 wt. %, for instance, at least 95 wt. % (for example, 100 wt. %)), fullerene crystals with desired shapes tend to be obtained with a particularly high yield. When containing a benzene derivative (A') whose content is at least 50 wt. %, the first solvent may includes, in addition to the benzene derivative (A'), one of the benzene derivatives indicated as examples of the benzene derivative (A) or a solvent other than that.

The characteristic group with which at least two hydrogen atoms of the benzene ring are substituted is, for instance, at least one selected from an alkyl group and halogen. Examples of the benzene derivative with a benzene ring in which at least two hydrogen atoms have been substituted include dialkylbenzene, dihalogenated benzene, trialkylbenzene, trihalogenated benzene, and halogenated toluene. The use of dialkylbenzene, trialkylbenzene, or halogenated toluene allows fullerene crystals to be produced with a high yield.

The fullerene (A) can be, for instance, C60, C70, C76, C78, C82, C84, C240, C540, or C720. Among them, C60, C70, C76, C78, C82, and C84 are used preferably, and C60 and C70 are used most preferably. Furthermore, fullerene may be used that contains an element (for instance, a typical metallic element or a transition metal element) other than the carbon element therein.

Next, the solution (A) and the second solution are mixed together through counter diffusion of the solution (A) and the second solvent and thereby crystals of the fullerene (A) deposit (Process (ii)). In the process (ii), the solution (A) and the second solvent are mixed together, which brings the fullerene (A) into a supersaturation state to deposit crystals thereof. Accordingly, the type and amount of the first solvent, the concentration of the fullerene contained in the solution (A), and the type and amount of the second solvent are selected so that the fullerene (A) is brought into the supersaturation state in the process (ii).

In the present specification, the "mixing through counter diffusion" denotes mixing that is caused mainly through diffusion (spontaneous diffusion) substantially unaffected by an external force and does not include mixing by stirring.

The process (ii) can be carried out, for example, as follows. That is, the solution (A) and the second solvent are brought into contact with each other so as to form a liquid-liquid interface therebetween, and then are allowed to stand still for a predetermined period of time. In other words, the solution (A) and the second solvent are allowed to stand still after the process (i) and thereby fullerene crystals can be obtained.

The fullerene single crystals obtained by the method of the present invention may be subjected to a treatment such as pressurizing (for instance, pressing at 3 Pa to 9 Pa), heating (for example, a heating treatment at 250° C. to 400° C.), or laser beam irradiation. When the laser beam irradiation is carried out, it is preferable that the fullerene single crystals be irradiated with a laser beam having a wavelength around the absorption peak of fullerene, for instance, a laser beam having a wavelength of 600 nm or shorter. The pressurizing, heating, or laser beam irradiation removes, for instance, the first solvent present between fullerene molecules that constitute the crystals to densify the crystals, and thereby the mechanical strength thereof can be improved. In an environment including no oxygen such as, for instance, a vacuum or a nitrogen atmosphere, it is preferable that the treatment be carried out at a lower temperature than the temperature (600° C.) at which fullerene starts subliming. When the heating is to be carried out in the air, it is preferable that the heating be carried out at 450° C. or lower since the crystals are decomposed at higher temperatures than 450° C.

In the method of the present invention, when the solution (A) or the second solvent is allowed to contain ions (for instance, potassium ions or iodine ions) of a predetermined element other than carbon, the element can be positioned between fullerene molecules of the fullerene crystals that deposit. Positioning of a specific element between fullerene molecules makes it possible to obtain fullerene crystals with various characteristics.

In the method of the present invention, fullerene crystals with various shapes can be obtained including, for instance, fibrous crystals (including needle crystals), particulate crystals, and flaky crystals. Since such fullerene single crystals have pi-bonds, other reactions or production of other substances can be expected to occur at the surfaces of the fullerene single crystals. Methods of manufacturing fullerene with various shapes are described below.

Embodiment 1

In Embodiment 1, the description is directed to a production method that allows fullerene crystals to be obtained with a particularly high yield. This production method employs, as the benzene derivative (A), at least one benzene derivative selected from the group consisting of dialkylbenzene, halogenated benzene, trialkylbenzene, trihalogenated benzene, 3-halogenated toluene, and alkoxybenzene. Among them, when at least one benzene derivative selected from the group consisting of a benzene derivative with a benzene ring that has been substituted at the meta-position, a benzene derivative with a benzene ring that has been substituted at the 1,3,5-positions, halogenated benzene, and alkoxybenzene is used as the benzene derivative (A), fibrous fullerene crystals (including needle fullerene crystals) can be obtained.

Examples of substituents of such benzene derivatives include a halogen and/or alkyl group. For instance, at least one benzene derivative selected from the group consisting of m-dialkylbenzene, m-dihalogenated benzene, halogenated benzene, 1,3,5-trialkylbenzene, 1,3,5-trihalogenated benzene, 3-halogenated toluene, and alkoxybenzene is used as the benzene derivative (A). More specifically, the benzene derivative (A) can be m-xylene, m-dichlorobenzene, m-diethylbenzene, m-dibromobenzene, m-difluorobenzene, chlorobenzene, 1,3,5-trimethylbenzene, 1,3,5-triethylbenzene, 1,3,5-trifluorobenzene, 3-chlorotoluene, 3-fluorotoluene, methoxybenzene (anisole), and ethoxybenzene. Among them, m-xylene, m-dichlorobenzene, 1,3,5-trimethylbenzene, 3-chlorotoluene, and methoxybenzene are particularly preferable. In this connection, the use of 1,3,5-trialkylbenzene, 3-halogenated toluene, or methoxybenzene makes it possible to obtain flocculent crystals formed of finer fibrous crystals. Furthermore, since alkoxybenzene (for instance, methoxybenzene or ethoxybenzene) has a high fullerene solubility, the use of alkoxybenzene as the benzene derivative (A) allows a larger amount of fullerene crystals to be obtained from a certain volume of solution.

The first solvent is most preferably one of the benzene derivatives described above but may be a mixture of two or more of the above-mentioned benzene derivatives. The first solvent contains at least 50 wt. % (preferably at least 75 wt. %, and more preferably at least 90 wt. %) of one or more of the above-mentioned benzene derivatives. Preferably, the first solvent has a fullerene solubility of at least 1.0 mg/ml. The first solvent may contain less than 50 wt. % of a solvent other than the above-mentioned benzene derivatives. Examples of such a solvent include benzene, toluene, ethylbenzene, propylbenzene, butylbenzene, carbon disulfide, 1,1,2,2-tetrachloroethane, 1-methylnaphthalene, dimethylnaphthalene, and 2-methylthiophene.

The solution (A) can be prepared by dissolving the fullerene (A) in the first solvent. An excessively low concentration of fullerene contained in the solution (A) results in a lower deposition rate at which fullerene single crystals deposit or a smaller amount of fullerene single crystals that deposit. Hence, the concentration of the fullerene (A) contained in the solution (A) is preferably at least 0.3 mg/ml as well as at least 0.15X (mg/ml), more preferably at least 0.5 mg/ml as well as at least 0.3X (mg/ml), where X (mg/ml) denotes the solubility of the fullerene (A) in the first solvent. For instance, the solubility (a saturated concentration) of C60 in m-xylene is about 1.4 mg/ml. Accordingly, when using m-xylene as the first solvent, the concentration of the fullerene is preferably at least 0.3 mg/ml, more preferably at least 0.5 mg/ml.

The second solvent to be used herein is at least one alcohol selected from the group consisting of, for instance, n-propyl alcohol, i-propyl alcohol, n-butyl alcohol, i-butyl alcohol, 2-butyl alcohol, n-pentyl alcohol, and i-pentyl alcohol. Methyl alcohol or ethyl alcohol has an excessively high diffusion rate and thereby causes difficulty in growing fullerene crystals, which tends to cause precipitation. Hence, it is not preferable that methyl alcohol or ethyl alcohol be used as the main component of the second solvent.

The second solvent is most preferably one of the alcohols described above but may be a mixture of two or more of the above-mentioned alcohols. The second solvent may contain at least 50 wt. % of one or more of the above-mentioned alcohols. The second solvent may contain less than 50 wt. % of a solvent other than the above-mentioned alcohols. Examples of such a solvent include methyl alcohol and ethyl alcohol.

In the process (i), the solution (A) and the second solvent are brought into contact with each other so as to form a liquid-liquid interface therebetween. For example, when the solution (A) is put into a container and then the second solvent is poured into the container gently, they are separated into two layers. As a result, the liquid-liquid interface is formed on the boundary between them.

Subsequently, the solution (A) and the second solvent that are in the above-mentioned state are allowed to stand still for a predetermined period of time (for instance, 10 hours to 100 hours). In this stage, the temperature of the solution (A) and the second solvent is preferably 20° C. or lower, more preferably 10° C. or lower. Furthermore, in order to allow crystals with a uniform size to deposit, it is preferable that the temperature of the solution (A) and the second solvent be set at a higher temperature than either the solidifying point of the solution (A) or that of the second solvent, whichever is higher.

Figure 2:
FIG. 2 is an electron micrograph of fibrous fullerene crystals obtained according to the present invention.
Figure 3:
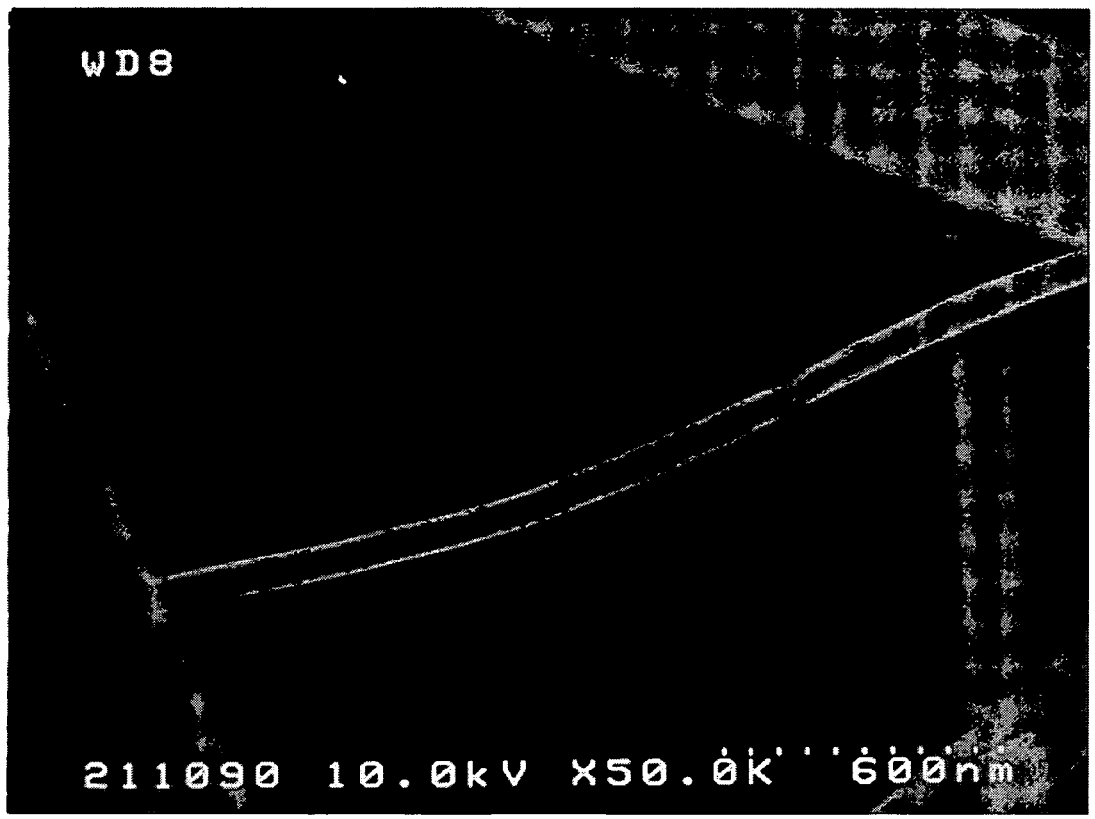
FIG. 3 is an electron micrograph in which the fibrous fullerene crystals shown in FIG. 2 have been magnified.
Figure 4:
FIG. 4 is an optical microphotograph of needle fullerene crystals obtained according to the present invention.

The solution (A) and the second solvent that are adjacent to each other at the liquid-liquid interface diffuse gradually into each other with the lapse of time. Fullerene deposits and grows mainly from the liquid-liquid interface. After the counter diffusion of the solution and the second solvent is completed (after the lapse of 10 to 100 hours), fullerene crystals are obtained. FIGS. 2 to 4 show photographs of three examples of fullerene crystals obtained by the method of the present invention. FIGS. 2 and 3 show field emission-type scanning electron microscope (FE-SEM) photographs. FIG. 2 shows a photograph taken at a magnification of 1000 times while FIG. 3 shows a photograph taken at a magnification of 50000 times. The crystals shown in the photographs in FIGS. 2 and 3 are fibrous fullerene single crystals with relatively small diameters. They are fibrous fullerene single crystals whose diameter and length are 60 nm to 1000 nm (0.06 µm to 1 µm) and at least 100 µm, respectively. The photograph shown in FIG. 4 is an optical microphotograph (taken at a magnification of 50 times). The crystals shown in the photograph in FIG. 4 are needle fullerene single crystals (having a diameter of about 25 µm and a length of about 3 mm) with relatively large diameters.

In the case where the solution (A) and the second solvent are mixed together rapidly without forming the liquid-liquid interface when the solution (A) and the second solvent are brought into contact with each other, fullerene deposits quickly in the solution and thereby a precipitation alone occurs. Similarly, even in the case where the liquid-liquid interface is formed, when the solution (A) and the second solvent then are not allowed to stand still but are mixed together rapidly, a precipitation alone occurs.

When toluene is used as the first solvent instead of the benzene derivative described above, a less amount of fullerene crystals deposit. In this case, the ratio of the amount of fullerene crystals to be obtained to the amount of fullerene dissolved in the solution (A) is about 30%. On the other hand, in the method of the present invention, the ratio of the amount of fullerene crystals to be obtained to the amount of fullerene dissolved in the solution (A) is high and the yield is, for instance, about 70% or higher.

The shapes of the fullerene crystals to be obtained according to the present invention vary with the types of the first and second solvents, the concentration of fullerene contained in the solution (A), the temperature at which fullerene deposits, etc. For example, when at least one selected from the group consisting of m-xylene, 1,3,5-trimethylbenzene, chlorobenzene, m-dichlorobenzene, 3-chlorotoluene, and methoxybenzene is used as the benzene derivative (A), fullerene crystals to be obtained have mainly fibrous shapes. The fibrous fullerene crystals have, for instance, an average diameter of 50 nm to 100 µm, an average length of 0.10 mm to 20 mm, and an aspect ratio of at least 100. In this context, the aspect ratio of the fibrous crystals denotes a ratio of length to diameter.

When using 1,3,5-trimethylbenzene as the benzene derivative (A) and using n-propyl alcohol, i-propyl alcohol, n-butyl alcohol, i-butyl alcohol, 2-butyl alcohol, n-pentyl alcohol, or i-pentyl alcohol as the second solvent, fibrous fullerene crystals deposit that have an average diameter of 50 nm to 2000 nm and an average length of 0.10 mm to 20 mm. These fullerene crystals often have a shape that looks flocculent when being observed visually. Nonwoven-fabric-like fullerene crystals are obtained by stacking the flocculent fullerene crystals together. For instance, a nonwoven fabric is obtained by forming fullerene crystals into a sheet on a perforated sheet.

When using m-xylene as the benzene derivative (A) and using n-propyl alcohol or i-propyl alcohol as the second solvent, fibrous fullerene crystals deposit that have an average diameter of 50 nm to 2000 nm and an average length of 0.10 mm to 20 mm. These fullerene crystals often have a shape that looks flocculent when being observed visually. As described above, nonwoven-fabric-like fullerene crystals are obtained by stacking the flocculent fullerene crystals together.

Furthermore, when using m-xylene as the benzene derivative (A) and using n-butyl alcohol, i-butyl alcohol, 2-butyl alcohol, n-pentyl alcohol, or i-pentyl alcohol as the second solvent, fibrous fullerene crystals deposit that have an average diameter of 2 µm to 100 µm, an average length of 0.2 mm to 20 mm, and an aspect ratio of at least 100. These fullerene crystals often have a shape that looks like a needle when being observed visually.

As described above, the production method of Embodiment 1 allows fibrous fullerene crystals to be obtained with a high yield. The production method of Embodiment 1 further may include, after the process (ii), a process of forming a nonwoven fabric using fibrous fullerene crystals obtained in the process (ii).

Embodiment 2

The production method of Embodiment 2 allows flaky fullerene crystals to be obtained. In the present specification, the term "flaky" denotes a shape that satisfies, for example: a relationship of $10 \leq L/D$, where D and L indicate the average thickness and the minimum size (the smallest diameter) of crystals, respectively; and a relationship of $20 \leq S^{1/2}/D$, where S and D indicate the maximum projected area and the average thickness, respectively. In this context, the maximum projected area S denotes a projected area that is obtained when the crystals are projected in a direction that allows the projected area to be maximum. The average thickness D is an average thickness of crystals with respect to the direction that allows the maximum projected area S to be obtained. The minimum size L denotes the smallest diameter of the shape projected so that the maximum projected area S is obtained.

This production method employs, as the benzene derivative (A), at least one benzene derivative selected from a benzene derivative with a benzene ring that has been substituted at the ortho-position and a benzene derivative with a benzene ring that has been substituted at the 1,2,4-positions.

The substituents that substitute at the ortho-position or the 1,2,4-positions of the benzene ring can be at least one selected from the group consisting of an alkyl group, halogen, $-NH_2$, $-NHR$, $-NR_2$, $-OH$, and $-OR$ (where R denotes an alkyl group). Among these substituents, a methyl group and a chlorine group are used preferably. More specifically, the benzene derivative (A) can be, for instance, o-xylene, o-dichlorobenzene, o-diethylbenzene, o-dibromobenzene, o-difluorobenzene, 1,2,4-trimethylbenzene, 1,2,4-triethylbenzene, and 2-chlorotoluene. Among them, o-xylene, o-dichlorobenzene, 1,2,4-trimethylbenzene, and 2-chlorotoluene are particularly preferable.

The first solvent is most preferably one of the benzene derivatives (A) described above but may be a mixture of two or more of the above-mentioned benzene derivatives (A). The first solvent contains at least 50 wt. % (preferably at least 75 wt. %, and more preferably at least 90 wt. %) of one or more of the above-mentioned benzene derivatives. Preferably, the first solvent has a fullerene solubility of at least 5 mg/ml. The first solvent may contain less than 50 wt. % of a solvent other than the above-mentioned benzene derivatives. Examples of such a solvent include benzene, toluene, ethylbenzene, propylbenzene, butylbenzene, iodobenzene, fluorobenzene, bromobenzene, p-xylene, 1,2,3-trimethylbenzene, 1,3,5-trimethylbenzene, m-dichlorobenzene, p-dichlorobenzene, carbon disulfide, trichloroethylene, 1,1,2,2-tetrachloroethane, 1-methylnaphthalene, dimethylnaphthalene, 2-methylthiophene, etc.

The solution (A) can be prepared by dissolving the fullerene (A) in the first solvent. An excessively low concentration of fullerene contained in the solution (A) results in a lower deposition rate at which fullerene single crystals deposit or a smaller amount of fullerene single crystals that deposit. Hence, the concentration of the fullerene (A) contained in the solution (A) is preferably at least 3 mg/ml as well as at least 0.3X (mg/ml), more preferably at least 4 mg/ml as well as at least 0.35X (mg/ml), where X (mg/ml) denotes the solubility of the fullerene (A) in the first solvent. For instance, the solubility (a saturated concentration) of C60 in o-xylene is about 8.7 mg/ml. Accordingly, the concentration of the fullerene is preferably at least 3 mg/ml, more preferably at least 4 mg/ml.

Alcohol with a side chain (having preferably a carbon number of 5 or less) and n-pentyl alcohol can be used as the second solvent. For instance, alcohols such as i-propyl alcohol, i-butyl alcohol, 2-butyl alcohol, n-pentyl alcohol, and i-pentyl alcohol are used preferably. Among them, i-propyl alcohol, i-butyl alcohol, 2-butyl alcohol, n-pentyl alcohol, and i-pentyl alcohol are particularly preferable. The use of n-propyl alcohol may allow flaky crystals to be obtained in some cases. Methyl alcohol or ethyl alcohol has an excessively high diffusion rate and thereby causes difficulty in growing flaky crystals. Hence, it is not preferable that methyl alcohol or ethyl alcohol be used as the main component of the second solvent.

When the benzene derivative (A) is o-xylene, it is preferable that i-propyl alcohol, i-butyl alcohol, or 2-butyl alcohol be used as the second solvent. On the other hand, when the benzene derivative (A) is 1,2,4-trimethylbenzene, it is preferable that i-butyl alcohol be used as the second solvent.

The second solvent is most preferably one of the alcohols described above but may be a mixture of two or more of the above-mentioned alcohols. The second solvent may contain at least 50 wt. % of one or more of the above-mentioned alcohols. The second solvent may contain less than 50 wt. % of a solvent other than the above-mentioned alcohols. Examples of such a solvent include methyl alcohol and ethyl alcohol.

In the method of Embodiment 2, the solution (A), the second solvent, and a solid wall are brought into contact with each other so that the solution (A) and the second solvent form a liquid-liquid interface and the solid wall and the solution (A) form a solid-liquid interface, in the process (i). For instance, as shown in FIG. 1, a solution (A) 12 is put into a container 11 and then a second solvent 13 is poured into the container 11 gently. The solution (A) 12 and the second solvent 13 are separated into two layers in the container 11 and thereby a liquid-liquid interface 14 is formed on the boundary between the two layers. In this stage, the solid-liquid interface is formed on the boundary between the solution (A) 11 and the bottom face or the side face (the solid wall) of the container 11. In this connection, a solid wall formed of, for instance, a glass sheet may be placed inside the container additionally and may be brought into contact with the solution (A).

The solid wall described above can be, for example, a container, a plate, a rod, or a fiber that is made of glass, ceramics, metal, plastics, single crystals, etc. Fullerene molecules are bonded to one another through the van der Waals bond. Accordingly, when fullerene molecules are allowed to stack on a amorphous substrate, a close-packed structure is formed readily. Hence, amorphous materials such as glass and plastics are used preferably for the material of the wall described above. Preferably, the surface area of the solid-liquid interface (the area of the solid wall surface that is brought into contact with the solution (A)) is at least 10 mm$^2$ although it depends on the volumes of the solution (A) and the second solvent to be used.

Next, the solution (A) and the second solvent that are in the state described above are allowed to stand still for a predetermined period of time (for instance, 10 hours to 100 hours). In this stage, the temperature of the solution (A) and the second solvent is preferably 20° C. or lower, more preferably 10° C. or lower. Furthermore, in order to allow crystals with a uniform size to deposit, it is preferable that the temperature of the solution (A) and the second solvent be set at a higher temperature than either the solidifying point of the solution (A) or that of the second solvent, whichever is higher.

The solution (A) and the second solvent that are present on the respective sides of the liquid-liquid interface gradually diffuse into each other with the lapse of time for which the state described above is maintained. Fullerene is expelled into the solution (A) from a mixture portion including the solution (A) and the second solvent that is generated around the liquid-liquid interface and has a certain thickness. As a result, the concentration of fullerene contained in the solution (A) increases gradually and the solution (A) then is supersaturated. Fullerene deposits on the surfaces of the solid walls such as the bottom and side faces of the container and then grows along planes that intersect the wall surfaces. After the counter diffusion of the solution (A) and the second solvent is completed (after the lapse of 10 to 100 hours), flaky fullerene crystals are obtained. First ends of the flaky fullerene crystals adhere to the solid wall but can be detached easily therefrom.

The process of deposition and growth of fullerene is considered to occur as follows. First, thin flaky fullerene single crystals having, for instance, a thickness of several tens of nanometers and a maximum size of 1 to several millimeters grow in such a manner as to rise from the surfaces of the solid walls. Thereafter, fullerene further stacks into layers on the principal surfaces (both surfaces) of the flakes. Eventually, flaky fullerene crystals are obtained that have a thickness of several hundreds of nanometers and a maximum size of 1 to several millimeters.

Figure 5:
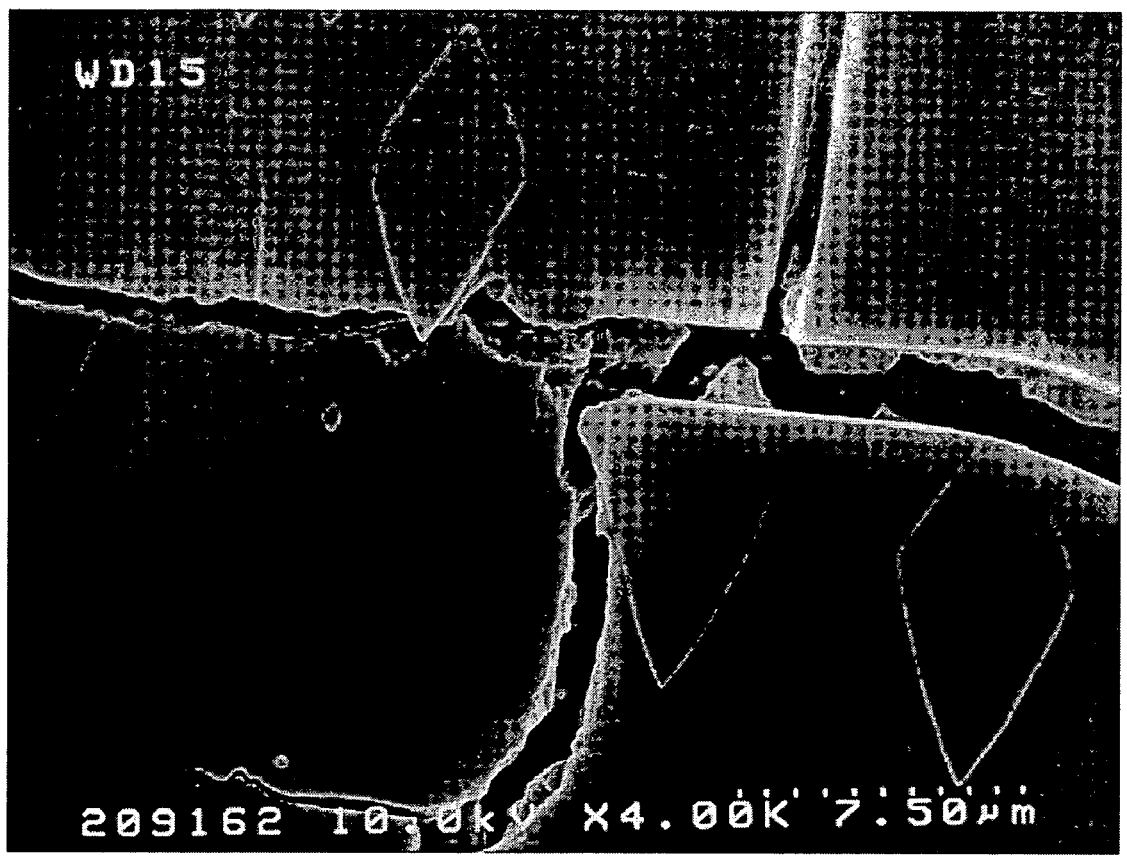
FIG. 5 is an electron micrograph of flaky fullerene crystals obtained according to the present invention, which was taken from the direction perpendicular to the face of the crystals.
Figure 6:
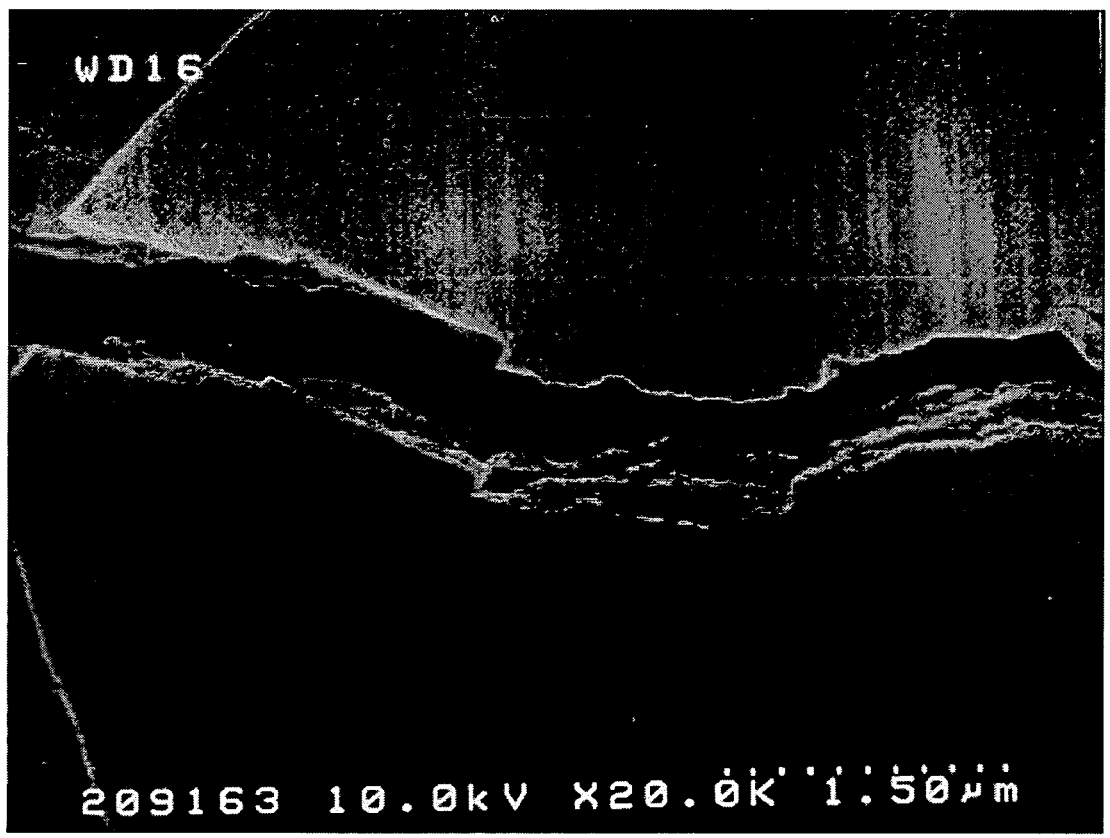
FIG. 6 is an electron micrograph of flaky fullerene crystals obtained according to the present invention, which was taken from an oblique direction.

FIGS. 5 and 6 are field emission-type scanning electron microscope (FE-SEM) photographs showing the surface of flaky fullerene crystals. These photographs are taken with part of the flake being broken so as to allow the cross-section thereof to be viewed easily. FIG. 5 shows a photograph (taken at a magnification of 4000 times) of a principal surface of the flake viewed in plan. FIG. 6 shows a photograph (taken at a magnification of 20000 times) of the principal surface of the flake viewed from the direction that inclines at an angle of 40 degrees from the direction perpendicular to the principal surface of the flake. In the photograph shown in FIG. 5, thin-layer fullerene single crystals whose shape is rhombic (with a maximum size of about 10 μm) have deposited on the surface of the flaky fullerene crystals. Conceivably, this deposition progresses to increase the area of the rhombuses gradually and thereby to allow the whole surface of the flaky crystals to be covered therewith, and the repetition of this increases the thickness of the flake. In the photograph shown in FIG. 6, the cross-section of the flaky fullerene crystals is shown and a layered structure thereof can be observed.

In the case where the solution (A) and the second solvent are mixed together rapidly without forming the liquid-liquid interface when the solution (A), the second solvent, and the solid wall are brought into contact with each other, fine-particle fullerene deposits quickly in the solution (A) and thus flaky fullerene crystals are not produced. Similarly, when the solution (A) and the second solvent are not allowed to stand still and thereby are mixed together rapidly, fine-particle fullerene deposits quickly and thus flaky fullerene crystals are not produced.

The method of Embodiment 2 makes it possible to obtain flaky fullerene crystals whose average thickness is 100 nm to 10 μm. It has been possible to form such flaky crystals on a substrate even by a conventional method (for instance, a sublimation method). In the conventional method, however, it was difficult to produce flaky crystals that are separated from the substrate. In this context, the "average thickness" denotes the average value of thicknesses of the flakes that is obtained by dividing the total of the thicknesses by the number of the flakes. In addition, the average maximum size described later denotes the average value of longer diameters (maximum sizes) of the flakes that is obtained by dividing the total of the longer diameters by the number of the flakes. The flaky fullerene crystals are formed of fullerene molecules bonded to one another through the van der Waals bond. Accordingly, the flaky fullerene crystals have a certain degree of mechanical strength that allows the fullerene crystals not to break upon application of force that is exerted by pinching with fingers.

Embodiment 3

The production method of Embodiment 3 allows particulate crystals to be obtained. In the present specification, the term "particulate" denotes a shape in which the ratio of the maximum diameter to the minimum diameter (the aspect ratio) is 3 or lower.

This production method employs, as the benzene derivative (A), at least one benzene derivative selected from a benzene derivative with a benzene ring that has been substituted at the para-position and a benzene derivative with a benzene ring that has been substituted at the 1, 2, 3-positions.

The substituents that substitute at the para-position of the benzene ring and those that substitute at the 1, 2, 3-positions of the benzene ring can be at least one selected from the group consisting of an alkyl group, halogen, —$NH_2$, —NHR, —$NR_2$, —OH, and —OR (where R denotes an alkyl group). Among these substituents, a methyl group and a chlorine group are particularly preferable. Examples of the benzene derivative (A) include p-xylene, p-diethylbenzene, p-difluorobenzene, 4-chlorotoluene, 1,2,3-trimethylbenzene, 1,2,3-triethylbenzene, etc. Among them, p-xylene, 1,2,3-trimethylbenzene, and 4-chlorotoluene are particularly preferable.

The first solvent is most preferably one of the benzene derivatives (A) described above but may be a mixture of two or more of the above-mentioned benzene derivatives (A). Preferably, the first solvent contains at least 50 wt. % (preferably at least 75 wt. %, and more preferably at least 90 wt. %) of one or more of the above-mentioned benzene derivatives. Preferably, the first solvent has a fullerene solubility of at least 5 mg/ml. The first solvent may contain less than 50 wt. % of a solvent other than the above-mentioned benzene derivatives. Examples of such a solvent include benzene, toluene, ethylbenzene, propylbenzene, butylbenzene, iodobenzene, fluorobenzene, bromobenzene, o-xylene, 1,2,4-trimethylbenzene, 1,3,5-trimethylbenzene, o-dichlorobenzene, m-dichlorobenzene, carbon disulfide, trichloroethylene, 1,1,2,2-tetrachloroethane, 1-methylnaphthalene, dimethylnaphthalene, 2-methylthiophene, etc.

The solution (A) can be prepared by dissolving the fullerene (A) in the first solvent. An excessively low concentration of fullerene contained in the solution (A) results in a lower deposition rate at which fullerene single crystals deposit or a smaller amount of fullerene single crystals that deposit. Hence, the concentration of the fullerene (A) contained in the solution (A) is preferably at least 3 mg/ml as well as at least 0.3X (mg/ml), more preferably at least 4 mg/ml as well as at least 0.35X (mg/ml), where X (mg/ml) denotes the solubility of the fullerene (A) in the first solvent. For instance, the solubility (a saturated concentration) of C60 in p-xylene is about 5.9 mg/ml. Accordingly, the concentration of the fullerene is preferably at least 3 mg/ml, more preferably at least 4 mg/ml.

The second solvent to be used preferably can be alcohol such as, for example, n-propyl alcohol, i-propyl alcohol, n-butyl alcohol, i-butyl alcohol, 2-butyl alcohol, n-pentyl alcohol, or i-pentyl alcohol. Among them, n-propyl alcohol, n-butyl alcohol, i-butyl alcohol, 2-butyl alcohol, n-pentyl alcohol, and i-pentyl alcohol are particularly preferable. Methyl alcohol or ethyl alcohol is not preferable since it has an excessively high diffusion rate to cause difficulty in growing particulate fullerene crystals and in turn tends to produce precipitation.

The second solvent is most preferably one of the alcohols described above but may be a mixture of two or more of the above-mentioned alcohols. The second solvent may contain at least 50 wt. % of one or more of the above-mentioned alcohols. The second solvent may contain less than 50 wt. % of a solvent other than the above-mentioned alcohols. Examples of such a solvent include methyl alcohol and ethyl alcohol.

In the process (i), the solution (A) and the second solvent are brought into contact with each other so as to form a liquid-liquid interface therebetween. For instance, when the solution (A) is put into a container and the second solvent then is poured into the container gently, they are separated into two layers. As a result, the liquid-liquid interface is formed on the boundary between them.

Subsequently, the solution (A) and the second solvent that are in the above-mentioned state are allowed to stand still for a predetermined period of time (for instance, 10 hours to 100 hours). In this stage, the temperature of the solution (A) and the second solvent is preferably 20° C. or lower, more preferably 10° C. or lower. Furthermore, in order to allow crystals with a uniform size to deposit, it is preferable that the temperature of the solution (A) and the second solvent be set at a higher temperature than either the solidifying point of the solution (A) or that of the second solvent, whichever is higher.

Figure 7:
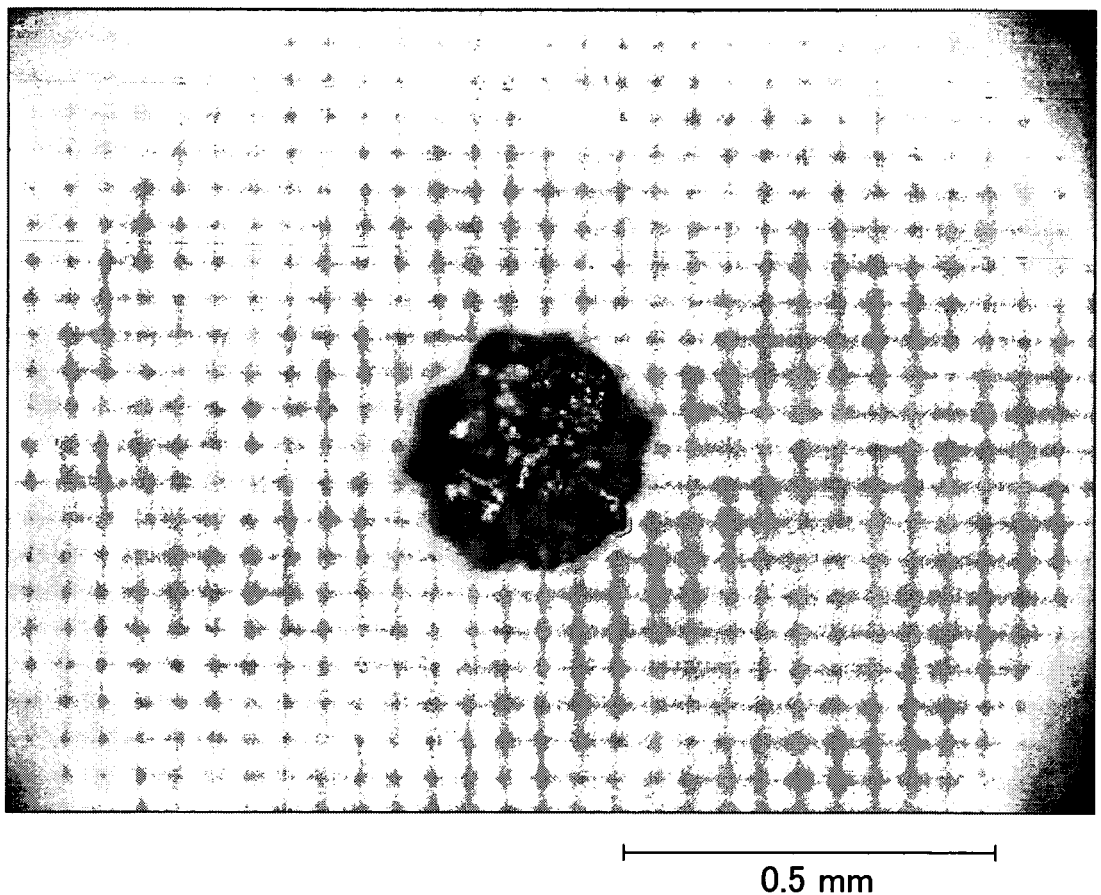
FIG. 7 is an optical microphotograph of a particulate fullerene crystal obtained according to the present invention.

The solution (A) and the second solvent that are adjacent to each other at the liquid-liquid interface diffuse gradually into each other with the lapse of time for which the state described above is maintained. Fullerene deposits and grows mainly from the liquid-liquid interface. After the counter diffusion of the solution and the second solvent is completed (after the lapse of 10 to 100 hours), fullerene crystals are obtained. FIG. 7 shows a photograph of one example of fullerene crystal obtained by the method of the present invention. FIG. 7 shows an optical microphotograph (taken at a magnification of 100 times) of a particulate fullerene crystal having a diameter of about 0.3 mm.

In the case where the solution (A) and the second solvent are mixed together rapidly without forming the liquid-liquid interface when the solution (A) and the second solvent are brought into contact with each other, fine-particle fullerene deposits quickly in the solution (A) and therefore no particulate fullerene crystals are produced. Similarly, when the solution (A) and the second solvent are not allowed to stand still but are mixed together rapidly, fullerene deposits quickly and therefore no particulate fullerene crystals are produced.

The method of Embodiment 3 makes it possible to obtain particulate fullerene crystals with an average particle size of 10 μm to 5000 μm and an aspect ratio of 2 or lower. In this context, the "average particle size" denotes the average value of maximum sizes of the particles that is obtained by dividing the total of the sizes by the number of the particles, while the "aspect ratio" denotes the ratio between the maximum size and the minimum size of a particle. The particulate fullerene crystals are formed of fullerene molecules bonded to one another by the van der Waals bond. Accordingly, the particulate fullerene crystals have a certain degree of mechanical strength that allows the fullerene crystals not to break upon application of force that is exerted by pinching with fingers.

EXAMPLES

The present invention is described below in detail using examples. The present invention, however, is not limited to the following production examples. In the examples described below, the reagent used as the first solvent has a purity of at least 95 wt. %.

Example 1

In Example 1, the description is directed to examples in which fullerene single crystals were produced by the production method of Embodiment 1.

Production Example 1

The solution (A) was prepared by dissolving 32 mg of fullerene C60 (with a purity of 99%, manufactured by SCIENCE LABORATORIES, INC.) in 20 ml of 1,3,5-trimethylbenzene (1,3,5-TMB, the first solvent). The fullerene contained in the solution (A) had a concentration of 1.6 mg/ml. The solubility (the saturated concentration at 25° C.) of fullerene C60 in 1,3,5-TMB is about 1.6 mg/ml.

Subsequently, 2 ml of the solution (A) thus prepared were put into a cylindrical glass container (with a diameter of 1.9 cm and a height of 3.2 cm). Thereafter, 4.0 ml of i-propyl alcohol (the second solvent) were added slowly thereto to flow down along the inner wall of the glass container so as to be prevented from being mixed with the solution (A). In the container, the two liquids were separated into a lower layer of the solution (A) with a depth of about 6 mm and an upper layer of the second solvent with a depth of about 10 mm. A circular liquid-liquid interface whose diameter was 1.9 cm was formed on the boundary between the lower layer and the upper layer. Thereafter, the container was covered with a lid and was allowed to stand still at 20° C. for 48 hours. As a result, a great number of fullerene single crystal fibers (whose total amount was about 2.6 mg) having a needle shape (with a diameter of 2 μm to 100 μm) were obtained that grew in the solution and then precipitated on the bottom surface of the glass container. About 80 wt. % of the fullerene used as a raw material was formed into fibers.

Comparative Production Example 1

In this example, the same process as in Production Example 1 was carried out except that the solution (A) was different from that used in Production Example 1. Specifically, 2 ml of toluene (with a saturated concentration of about 2.8 mg/ml) was used instead of 2 ml of 1,3,5-trimethylbenzene in preparing the solution (A), and the fullerene concentration was set at 2.8 mg/ml. As a result, a great number of fullerene single crystal fibers (whose total amount was about 1.7 mg) having a needle shape (with a diameter of 2 μm to 100 μm) were obtained that grew in the solution and then precipitated on the bottom surface of the glass container. About 30 wt. % of the fullerene used as a raw material was formed into fibers. The rest, i.e. 70 wt. %, of the fullerene became precipitation.

Production Example 2

The solution (A) was prepared by dissolving 24 mg of fullerene C60 (with a purity of 99%, manufactured by SCIENCE LABORATORIES, INC.) in 20 ml of m-xylene (the first solvent). The fullerene contained in the solution (A) had a concentration of 1.2 mg/ml. The solubility (the saturated concentration) of C60 in m-xylene is about 1.4 mg/ml.

Subsequently, 2 ml of the solution (A) thus prepared were put into a cylindrical glass container (with a diameter of 1.9 cm and a height of 3.2 cm). Thereafter, 4.0 ml of n-propyl alcohol (the second solvent) were added slowly thereto to flow down along the inner wall of the glass container so as to be prevented from being mixed with the solution (A). In the container, the two liquids were separated into a lower layer of the solution (A) with a depth of about 6 mm and an upper layer of the second solvent with a depth of about 10 mm. A circular liquid-liquid interface whose diameter was 1.9 cm was formed on the boundary between the lower layer and the upper layer. Thereafter, the container was covered with a lid and was allowed to stand still at 20° C. for 48 hours. As a result, a great number of fullerene single crystal fibers (whose diameter was 2 μm to 100 μm and whose total amount was about 1.8 mg) were obtained that grew in the solution and then precipitated on the bottom surface of the glass container. About 75 wt. % of the fullerene used as a raw material was formed into fibers.

Production Examples 3 to 15

Fullerene crystals were produced by the same method as in Production Example 2 except that the first solvent, the second solvent, or the fullerene concentration was different from that employed in Production Example 2. Specifically, as shown in Table 1, m-dichlorobenzene (m-DCB), 3-chlorotoluene, or methoxybenzene was used instead of m-xylene (the first solvent). Furthermore, 2-butyl alcohol (2-BuA), n-butyl alcohol (n-BuA), i-butyl alcohol (i-BuA), i-butyl alcohol (i-BuA), i-propyl alcohol (i-PrA), i-pentyl alcohol (i-PeA), n-pentyl alcohol (n-PeA), or ethyl alcohol (EtA) was used instead of n-propyl alcohol (the second solvent). The amount of the solvent was the same as in Production Example 2. With this process, fibrous or particulate fullerene single crystals (whose average diameter was 0.1 μm to 200 μm) were obtained. The results thus obtained are shown in Table 1.

In Production Example 13, a mixed solvent of m-xylene (80 vol. %) and o-xylene (20 vol. %) was used as the first solvent while a mixed solvent of i-butyl alcohol (80 vol. %) and ethyl alcohol (20 vol. %) was used as the second solvent. Furthermore, when flocculent fullerene crystals obtained in Production Example 4 and the other examples were poured onto a filter paper together with the solution and then they were dried, they were shaped into the form of a nonwoven fabric.

Production Example 16

Fullerene crystals were produced by the same method as in Production Example 2 except that fullerene C70 (with a purity of 99%, manufactured by SCIENCE LABORATORIES, INC.) was used instead of fullerene C60 and 4 ml of i-butyl alcohol (i-BuA) was used instead of 4 ml of n-propyl alcohol (the second solvent). As a result, flocculent fullerene single crystals indicated in Table 1 were obtained.

TABLE 1

| P.E.* | First Solvent Type | First Solvent Amount [ml] | Fullerene Concentration Solubility [mg/ml] | Second Solvent Type | Second Solvent Amount [ml] |
|---|---|---|---|---|---|
| P.E. 1 | 1,3,5-TMB | 2.0 | 1.6 / 1.6 | i-PrA | 4.0 |
| C.P.E. 1 | toluene | 2.0 | 2.8 / 2.8 | i-PrA | 4.0 |
| P.E. 2 | m-xylene | 2.0 | 1.2 / 1.4 | n-PrA | 4.0 |
| P.E. 3 | 1,3,5-TMB | 2.0 | 0.6 / 1.6 | 2-BuA | 4.0 |
| P.E. 4 | 1,3,5-TMB | 2.0 | 1.5 / 1.6 | n-PrA | 4.0 |
| P.E. 5 | m-xylene | 2.0 | 1.2 / 1.4 | n-BuA | 4.0 |
| P.E. 6 | m-xylene | 2.0 | 0.6 / 1.4 | 2-BuA | 4.0 |
| P.E. 7 | 1,3,5-TMB | 2.0 | 1.5 / 1.6 | i-BuA | 4.0 |
| P.E. 8 | 1,3,5-TMB | 2.0 | 1.5 / 1.6 | i-PrA | 4.0 |
| P.E. 9 | 1,3,5-TMB | 2.0 | 1.2 / 1.6 | n-PeA | 4.0 |
| P.E. 10 | 1,3,5-TMB | 2.0 | 1.5 / 1.6 | i-PeA | 4.0 |
| P.E. 11 | m-DCB | 2.0 | 2.0 / 2.4 | i-BuA | 4.0 |
| P.E. 12 | m-xylene | 2.0 | 1.4 / 1.4 | i-BuA | 4.0 |
| P.E. 13 | m-xylene / o-xylene | 1.6 / 0.4 | 2.6 / 2.8 | i-BuA / EtA | 3.2 / 0.8 |
| P.E. 14 | 3-chlorotoluene | 2.0 | 2.0 / — | i-PrA | 4.0 |
| P.E. 15 | methoxybenzene | 2.0 | 4.4 / 5.6 | i-PrA | 4.0 |
| P.E. 16 | m-xylene | 2.0 | 4.0 / 5.2 | i-BuA | 4.0 |

| P.E.* | Shape | Average Diameter [μm] | Length [mm] | Produced Amount [mg] | Yield [%] |
|---|---|---|---|---|---|
| P.E. 1 | Needle | 2-100 | 0.5-10 | 2.6 | 80 |
| C.P.E. 1 | Needle | 2-100 | 0.5-10 | 1.7 | 30 |
| P.E. 2 | Needle | 2-100 | 0.5-10 | 1.8 | 75 |
| P.E. 3 | Flocculate | 0.2 | 0.5 | 1.0 | 83 |
| P.E. 4 | Flocculate | 1 | 1 | 2.4 | 80 |
| P.E. 5 | Needle | 100 | 4 | 1.7 | 71 |
| P.E. 6 | Needle | 100 | 4 | 0.9 | 75 |

TABLE 1-continued

| P.E. 7 | Flocculate | 1 | 2 | 2.4 | 80 |
|---|---|---|---|---|---|
| P.E. 8 | Flocculate | 1 | 2 | 2.6 | 87 |
| P.E. 9 | Flocculate | 1 | 2 | 1.7 | 71 |
| P.E. 10 | Flocculate | 1 | 1 | 2.3 | 77 |
| P.E. 11 | Flocculate | 0.5 | 2 | 3.0 | 75 |
| P.E. 12 | Needle | 100 | 4 | 2.3 | 82 |
| P.E. 13 | Flocculate | 1 | 1 | 3.7 | 71 |
| P.E. 14 | Flocculate | 0.1-1 | 0.5-10 | 3.0 | 75 |
| P.E. 15 | Flocculate | 0.3 | 1.5-100 | 6.5 | 75 |
| P.E. 16 | Flocculate | 1 | 2 | 6.4 | 80 |

*P.E. denotes Production Example.
*C.P.E. denotes Comparative Production Example.

Comparative Production Example 2

In this example, the same process as in Production Example 1 was carried out except that the solution (A) was different from that used in Production Example 1. Specifically, in preparing the solution (A), common xylene (manufactured by Ueno Chemical Industries., Ltd., the special grade xylene) that had not been subjected to isomer separation was used instead of 2 ml of 1,3,5-trimethylbenzene. The fullerene concentration was set at 3.9 mg/ml. As a result, 2.9 mg of fullerene crystals were obtained. The yield was as low as 37%.

Example 2

In Example 2, the description is directed to examples in which flaky fullerene crystals were produced by the production method of Embodiment 2.

Production Example 1

The solution (A) was prepared by dissolving 66 mg of fullerene C60 (with a purity of 99%, manufactured by SCIENCE LABORATORIES, INC.) in 20 ml of o-xylene (the first solvent). The fullerene contained in the solution (A) had a concentration of 3.3 mg/ml. The solubility (the saturated concentration at 25° C.) of C60 in o-xylene is about 8.7 mg/ml.

Subsequently, 2 ml of the solution (A) thus prepared were put into a cylindrical glass container (with a diameter of 1.9 cm and a height of 3.2 cm). Thereafter, 4 ml of i-propyl alcohol (the second solvent) were added slowly thereto to flow down along the inner wall of the glass container so as to be prevented from being mixed with the solution (A). In the container, the two liquids were separated into a lower layer of the solution (A) with a depth of about 6 mm and an upper layer of the second solvent with a depth of about 10 mm. A circular liquid-liquid interface whose diameter was 1.9 cm was formed on the boundary between the lower layer and the upper layer. Thereafter, the container was covered with a lid and was allowed to stand still at 10° C. for 48 hours. As a result, flaky fullerene crystals (whose average thickness was about 0.4 μm, whose average maximum size was about 2 mm, and whose total amount was about 4.6 mg) grew from the inner surface of the bottom of the glass container toward the upper part of the container.

Production Examples 2 to 11

Fullerene crystals were produced by the same method as in Production Example 1 except that the first solvent, the second solvent, or the fullerene concentration was different from that employed in Production Example 1. Specifically, as shown in Table 1, 1,2,4-trimethylbenzene (1,2,4-TMB), o-dichlorobenzene (o-DCB), or 2-chlorotoluene was used instead of o-xylene (the first solvent). Furthermore, i-pentyl alcohol (i-PeA), n-pentyl alcohol (n-PeA), i-butyl alcohol (i-BuA), or 2-butyl alcohol (2-BuA) was used instead of i-propyl alcohol (the second solvent). The amount of the solvent was the same as in Production Example 1. In Production Examples 2 to 11, flaky fullerene crystals were obtained as in Production Example 1. In Production Example 10, a mixed solvent of i-propyl alcohol (50 vol. %) and i-butyl alcohol (50 vol. %) was used as the second solvent.

Production Example 12

Fullerene crystals were produced by the same method as in Production Example 1 except that fullerene C70 (with a purity of 99%, manufactured by SCIENCE LABORATORIES, INC.) and n-propyl alcohol were used instead of fullerene C60 and 4 ml of i-propyl alcohol, respectively (the second solvent). As a result, flaky fullerene single crystals were obtained. Table 2 indicates the production conditions and shapes of the crystals. The solubility (the saturated concentration) of C70 in n-propyl alcohol is that obtained at 20° C.

TABLE 2

| P.E.* | First Solvent | | Fullerene Concentration [mg/ml] Solubility [mg/ml] | Second Solvent | |
|---|---|---|---|---|---|
| | Type | Amount [ml] | | Type | Amount [ml] |
| P.E. 1 | o-xylene | 2.0 | 3.3 8.7 | i-PrA | 4.0 |
| P.E. 2 | o-xylene | 2.0 | 8.7 8.7 | i-PrA | 4.0 |
| P.E. 3 | o-xylene | 2.0 | 6.5 8.7 | i-PeA | 4.0 |
| P.E. 4 | 1,2,4-TMB | 2.0 | 15.0 17.9 | i-PeA | 4.0 |
| P.E. 5 | 1,2,4-TMB | 2.0 | 7.5 17.9 | i-BuA | 4.0 |
| P.E. 6 | o-xylene | 2.0 | 3.3 8.7 | n-PeA | 4.0 |
| P.E. 7 | o-xylene | 2.0 | 8.7 8.7 | 2-BuA | 4.0 |
| P.E. 8 | o-DCB | 2.0 | 10 24.6 | i-BuA | 4.0 |
| P.E. 9 | o-DCB | 2.0 | 24.6 24.6 | i-PeA | 4.0 |
| P.E. 10 | o-xylene | 2.0 | 6.5 8.7 | i-PrA i-BuA | 2.0 2.0 |
| P.E. 11 | 2-chlorotoluene | 2.0 | 4.0 — | i-BuA | 4.0 |
| P.E. 12 | o-xylene | 2.0 | 10.0 14.6 | n-PrA | 4.0 |

| P.E.* | Flaky Crystals | | |
|---|---|---|---|
| | Average Thickness [μm] | Average Maximum Size [mm] | Produced Amount [mg] |
| P.E. 1 | 0.4 | 2 | 4.6 |
| P.E. 2 | 1.5 | 4 | 12.2 |
| P.E. 3 | 2.0 | 3 | 7.0 |
| P.E. 4 | 2.0 | 2 | 18 |
| P.E. 5 | 1.5 | 3 | 7.5 |
| P.E. 6 | 0.5 | 3 | 4.5 |
| P.E. 7 | 2.0 | 3 | 12.0 |
| P.E. 8 | 2.5 | 0.5 | 3.5 |
| P.E. 9 | 2.0 | 0.5 | 19.7 |
| P.E. 10 | 1.0 | 2 | 9 |
| P.E. 11 | 0.5 | 2.5 | 5.8 |
| P.E. 12 | 1.0 | 2 | 16.0 |

*P.E. denotes Production Example.

Comparative Production Example 1

Fullerene crystals were produced by the same method as in Production Example 1 except that 2 ml of toluene and 4 ml of i-propyl alcohol were used instead of 2 ml of o-xylene (the first solvent) and 4 ml of i-propyl alcohol (the second solvent), respectively, and a fullerene concentration of 2.8 mg/ml (a saturated concentration of about 2.8 mg/ml) was employed. As a result, a great number of needle single crystals (whose average diameter was about 1 μm, whose average length was about 0.5 mm, and whose total amount was about 4 mg) deposited that grew from the liquid-liquid interface. However, no flaky fullerene crystals were obtained.

Comparative Production Example 2

Fullerene crystals were produced by the same method as in Production Example 1 except that 2 ml of benzene and 4 ml of i-propyl alcohol were used instead of 2 ml of o-xylene (the first solvent) and 4 ml of i-propyl alcohol (the second solvent), respectively, and a fullerene concentration of 1.4 mg/ml (a saturated concentration of about 1.6 mg/ml) was employed. As a result, a great number of particulate crystals (whose average diameter was about 100 μm and whose total amount was about 2 mg) deposited that grew from the liquid-liquid interface. However, no flaky fullerene crystals were obtained.

Example 3

In Example 3, the description is directed to examples in which particulate fullerene crystals were produced by the production method of Embodiment 3.

Production Example 1

The solution (A) was prepared by dissolving 100 mg of fullerene C60 (with a purity of 99%, manufactured by SCIENCE LABORATORIES, INC.) in 20 ml of p-xylene (the first solvent). The fullerene contained in the solution (A) had a concentration of 5.0 mg/ml. The solubility (the saturated concentration) of C60 in p-xylene was about 5.9 mg/ml.

Subsequently, 2 ml of the solution (A) thus prepared were put into a cylindrical glass container (with a diameter of 1.9 cm and a height of 3.2 cm). Thereafter, 4 ml of i-propyl alcohol (the second solvent) were added slowly thereto over about 60 seconds to flow down along the inner wall of the glass container so as to be prevented from being mixed with the solution (A). In the container, the two liquids were separated into a lower layer of the solution (A) with a depth of about 6 mm and an upper layer of the second solvent with a depth of about 10 mm. A circular liquid-liquid interface whose diameter was 1.9 cm was formed on the boundary between the lower layer and the upper layer. Thereafter, the container was covered with a lid and was allowed to stand still at 10° C. for 48 hours. As a result, a great number of fullerene crystals (whose total amount was about 7 mg) were obtained that grew in the solution and then precipitated on the bottom surface of the glass container. The crystals had a particle shape with an average particle size of about 200 μm and an aspect ratio of about 1.0.

Production Examples 2 to 9

In Production Examples 2 to 9, fullerene crystals were produced by the same method as in Production Example 1 except that the first solvent, the second solvent, or the fullerene concentration was different from that employed in Production Example 1. Specifically, as shown in Table 1, 4-chlorotoluene was used instead of p-xylene (the first solvent). Furthermore, 2-butyl alcohol (2-BuA), n-butyl alcohol (n-BuA), i-butyl alcohol (i-BuA), n-propyl alcohol (n-PrA), or ethyl alcohol (EtA) was used instead of i-propyl alcohol (the second solvent). The amount of the solvent used herein was the same as in Production Example 1. As a result, particulate fullerene crystals (whose average particle diameter was 200 μm to 500 μm) were obtained. The results are shown in Table 1.

In Production Example 8, a mixed solvent of i-butyl alcohol (80 vol. %) and ethyl alcohol (20 vol. %) was used as the second solvent.

Comparative Production Example 1

Fullerene crystals were produced by the same method as in Production Example 1 except that 2 ml of toluene and 4 ml of i-propyl alcohol were used instead of 2 ml of p-xylene (the first solvent) and 4 ml of i-propyl alcohol (the second solvent), respectively, and a fullerene concentration of 2.8 mg/ml (a saturated concentration of about 2.8 mg/ml) was employed. As a result, a great number of needle single crystals (whose average diameter was about 1 μm, whose average length was about 0.5 mm, and whose total amount was about 3 mg) deposited that grew from the liquid-liquid interface. However, no particulate fullerene crystals were obtained.

INDUSTRIAL APPLICABILITY

The present invention allows fullerene crystals having various shapes to be produced with a high yield. The fullerene crystals obtained according to the present invention are applicable in various fields. For instance, they are applicable to a study of fullerene crystals, members of minute machines (for example, a shaft of a micromachine), materials of unwoven fabrics, etc.

TABLE 3

| P.E.* | First Solvent Type | First Solvent Amount [ml] | Fullerene Concentration [mg/ml] Solubility [mg/ml] | Second Solvent Type | Second Solvent Amount [ml] | Particulate Crystals Average Particle Diameter [μm] | Particulate Crystals Produced Amount [mg] |
|---|---|---|---|---|---|---|---|
| P.E. 1 | p-xylene | 2.0 | 5.0 / 5.9 | n-BuA | 4.0 | 200 | 7 |
| P.E. 2 | 1,2,3-TMB | 2.0 | 4.5 / 4.7 | 2-BuA | 4.0 | 400 | 5 |
| P.E. 3 | p-xylene | 2.0 | 5.0 / 5.9 | i-BuA | 4.0 | 500 | 7 |
| P.E. 4 | p-xylene | 2.0 | 5.0 / 5.9 | 2-BuA | 4.0 | 500 | 7 |
| P.E. 5 | 1,2,3-TMB | 2.0 | 4.5 / 4.7 | n-PrA | 4.0 | 200 | 5 |
| P.E. 6 | 1,2,3-TMB | 2.0 | 4.5 / 4.7 | n-BuA | 4.0 | 500 | 5 |
| P.E. 7 | 1,2,3-TMB | 2.0 | 4.5 / 4.7 | i-BuA | 4.0 | 400 | 5 |
| P.E. 8 | p-xylene | 2.0 | 5.0 / 5.9 | i-BuA / EtA | 3.2 / 0.8 | 300 | 6 |
| P.E. 9 | 4-chlorotoluene | 2.0 | 3.0 | n-BuA | 4.0 | 200 | 5 |

*P.E. denotes Production Example.

Production Example 10

Fullerene crystals were produced by the same method as in Production Example 1 except that 100 mg of fullerene C70 (with a purity of 99%, manufactured by SCIENCE LABORATORIES, INC.) were used instead of fullerene C60 (100 mg). As a result, a great number of fullerene crystals (whose total amount was about 7 mg) were obtained. The crystals had a particle shape with an average particle diameter of about 200 μm and an aspect ratio of about 1.0.

The invention claimed is:

1. A method for producing fullerene crystals comprising:
   i) bringing a solution and a second solvent into contact with each other so that a liquid-liquid interface is formed therebetween, the solution including a first solvent containing a benzene derivative (A) whose content is at least 50 wt. % and fullerene dissolved in the first solvent, and the second solvent having a lower solubility of the fullerene than that of the first solvent; and ii) allowing the solution and the second solvent to be mixed together through counter diffusion of the solution and the second solvent to deposit crystals of the fullerene, wherein the benzene derivative (A) is at least one benzene derivative selected from the group consisting of a benzene derivative in which at least two hydrogen atoms of a benzene ring have been substituted, halogenated benzene, and alkoxybenzene.

2. The method for producing fullerene crystals according to claim 1, wherein in the process (ii), the solution and the second solvent are mixed together by allowing the solution stand still for a predetermined period of time.

3. The method for producing fullerene crystals according to claim 1, wherein the benzene derivative (A) is one type of benzene derivative with no structural isomerism or one selected from a plurality of structural isomers of one type of benzene derivative with structural isomerism.

4. The method for producing fullerene crystals according to claim 1, wherein the solubility of the fullerene in the second solvent is 0.01 mg/ml or lower at 25° C.

5. The method for producing fullerene crystals according to claim 1, wherein the benzene derivative (A) is at least one benzene derivative selected from the group consisting of a benzene derivative with a benzene ring that has been substituted at the meta position, a benzene derivative with a benzene ring that has been substituted at 1,3,5-positions, halogenated benzene, and alkoxybenzene.

6. The method for producing fullerene crystals according to claim 5, wherein the benzene derivative (A) is at least one benzene derivative selected from the group consisting of m-dialkylbenzene, m-dihalogenated benzene, halogenated benzene, 1,3,5-trialkylbenzene, 1,3,5-trihalogenated benzene, 3-halogenated toluene, and alkoxybenzene.

7. The method for producing fullerene crystals according to claim 5, wherein the benzene derivative (A) is at least one selected from the group consisting of m-xylene, 1,3,5-trimethylbenzene, chlorobenzene, m-dichlorobenzene, 3-chlorotoluene, and methoxybenzene.

8. The method for producing fullerene crystals according to claim 5, wherein the second solvent contains, in total, at least 50 wt. % of at least one alcohol selected from the group consisting of n-propyl alcohol, i-propyl alcohol, n-butyl alcohol, i-butyl alcohol, 2-butyl alcohol, n-pentyl alcohol, and i-pentyl alcohol.

9. The method for producing fullerene crystals according to claim 5, wherein the concentration of the fullerene contained in the solution is at least 0.3 mg/ml as well as at least 0.15X (mg/ml), where X (mg/ml) denotes the solubility of the fullerene in the first solvent.

10. The method for producing fullerene crystals according to claim 5, further comprising forming a nonwoven fabric using the fullerene crystals.

11. The method for producing fullerene crystals according to claim 1, wherein the benzene derivative (A) is at least one selected from a benzene derivative with a benzene ring that has been substituted at the ortho-position, and a benzene derivative with a benzene ring that has been substituted at 1,2,4-positions, and in the process (i), a solid wall is placed to form a solid-liquid interface with the solution.

12. The method for producing fullerene crystals according to claim 11, wherein the benzene derivative (A) is at least one selected from the group consisting of o-xylene, 1,2,4-trimethylbenzene, o-dichlorobenzene, and 2-chlorotoluene.

13. The method for producing fullerene crystals according to claim 11, wherein the second solvent contains at least 50 wt. % of at least one alcohol selected from the group consisting of alcohol with a side chain and n-pentyl alcohol.

14. The method for producing fullerene crystals according to claim 13, wherein the second solvent is at least one alcohol selected from the group consisting of i-propyl alcohol, i-butyl alcohol, 2-butyl alcohol, n-pentyl alcohol, and i-pentyl alcohol.

15. The method for producing fullerene crystals according to claim 11, wherein the concentration of the fullerene contained in the solution is at least 3 mg/ml as well as at least 0.3X (mg/ml), where X (mg/ml) denotes the solubility of the fullerene in the first solvent.

16. The method for producing fullerene crystals according to claim 1, wherein the benzene derivative (A) is at least one selected from a benzene derivative with a benzene ring that has been substituted at the para-position, and a benzene derivative with a benzene ring that has been substituted at 1,2,3-positions.

17. The method for producing fullerene crystals according to claim 16, wherein the benzene derivative (A) is at least one selected from the group consisting of p-xylene, 1,2,3-trimethylbenzene, p-dichlorobenzene, and 4-chlorotoluene.

18. The method for producing fullerene crystals according to claim 16, wherein the second solvent contains, in total, at least 50 wt. % of at least one selected from the group consisting of n-propyl alcohol, n-butyl alcohol, i-butyl alcohol, 2-butyl alcohol, n-pentyl alcohol, and i-pentyl alcohol.

19. The method for producing fullerene crystals according to claim 16, wherein the concentration of the fullerene contained in the solution is at least 3 mg/ml as well as at least 0.3X (mg/ml), where X (mg/ml) denotes the solubility of the fullerene in the first solvent.

20. The method for producing fullerene crystals according to claim 1, further comprising carrying out at least one treatment on the fullerene crystals obtained in the process (ii), the at least one treatment being selected from the group consisting of pressurizing, heating, and laser irradiation.

21. The method for producing fullerene crystals according to claim 1, wherein the fullerene includes an element other than carbon therein.

22. The method for producing fullerene crystals according to claim 1, wherein the fullerene is C60 or C70.

* * * * *